US012568770B2

(12) United States Patent
Wang

(10) Patent No.: US 12,568,770 B2
(45) Date of Patent: Mar. 3, 2026

(54) SEMICONDUCTOR MEMORY DEVICE AND FABRICATION METHOD THEREOF

(71) Applicant: UNITED MICROELECTRONICS CORP., Hsin-Chu City (TW)

(72) Inventor: Hui-Lin Wang, Taipei City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 483 days.

(21) Appl. No.: 18/134,039

(22) Filed: Apr. 13, 2023

(65) Prior Publication Data

US 2024/0315142 A1     Sep. 19, 2024

(30) Foreign Application Priority Data

Mar. 14, 2023     (TW) ................................. 112109281

(51) Int. Cl.
　　*H10N 50/10*　　　(2023.01)
　　*H10B 61/00*　　　(2023.01)
　　*H10N 50/01*　　　(2023.01)
(52) U.S. Cl.
　　CPC ............. *H10N 50/10* (2023.02); *H10B 61/00* (2023.02); *H10N 50/01* (2023.02)
(58) Field of Classification Search
　　CPC ......... H10N 50/10; H10B 61/00; H10B 61/22
　　See application file for complete search history.

(56) References Cited

U.S. PATENT DOCUMENTS

| 2009/0166817 | A1* | 7/2009 | Tsai | ................... | H01L 23/53295 |
| | | | | | 257/E23.001 |
| 2018/0159023 | A1* | 6/2018 | Suh | ......................... | H10N 50/80 |
| 2019/0088656 | A1* | 3/2019 | Kim | ......................... | H10B 61/22 |
| 2020/0176510 | A1* | 6/2020 | Wang | ...................... | G11C 11/16 |

OTHER PUBLICATIONS

Wang, the specification, including the claims, and drawings in the U.S. Appl. No. 17/343,768, filed Jun. 10, 2021.

* cited by examiner

*Primary Examiner* — Shih Tsun A Chou
(74) *Attorney, Agent, or Firm* — Winston Hsu

(57)　　　　　ABSTRACT

A semiconductor memory device includes a substrate, a first interlayer dielectric layer, a second interlayer dielectric layer, a via in the second interlayer dielectric layer in a memory region, and a data storage structure on the via. The second interlayer dielectric layer includes a first recess structure and a second recess structure. The first recess structure has a first recessed thickness between the bottom surface of the data storage structure and the lowest point of the second interlayer dielectric layer in the memory area. The second recess structure has a second recessed thickness between the bottom surface of the data storage structure and the lowest point of the logic circuit region. The first recessed thickness ranges between 300-650 angstroms, and the second recessed thickness ranges between 300-800 angstroms.

30 Claims, 13 Drawing Sheets

SEMICONDUCTOR MEMORY DEVICE AND FABRICATION METHOD THEREOF

BACKGROUND OF THE INVENTION

1. Field of the Invention

The invention relates to the technical field of semiconductor memory, in particular to an improved magnetic random access memory structure and a manufacturing method thereof.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

It is one object of the present invention to provide an improved magnetic random access memory structure and its manufacturing method to solve the deficiencies or shortcomings of the prior art.

One aspect of the invention provides a semiconductor memory device including a substrate comprising a memory region and a logic circuit region; a first interlayer dielectric layer on the substrate; a second interlayer dielectric layer on the first interlayer dielectric layer; at least one via in the second interlayer dielectric layer within the memory region; and at least one data storage structure stacked on the at least one via. The second interlayer dielectric layer comprises a first recess structure with a first recessed thickness between a bottom surface of the at least one data storage structure and a lowest point of the second interlayer dielectric layer within the memory region, and a second recess structure with a second recessed thickness between the bottom surface of the at least one data storage structure and a lowest point of the second interlayer dielectric layer within the logic circuit region.

According to some embodiments, the first recessed thickness ranges between 300-650 angstroms and the second recessed thickness ranges between 300-800 angstroms.

According to some embodiments, the second interlayer dielectric layer comprises a step structure at an interface between the memory region and the logic circuit region.

According to some embodiments, the data storage structure comprises a bottom electrode, a magnetic tunneling junction (MTJ) element on the bottom electrode, and a top electrode on the MTJ element.

According to some embodiments, the second interlayer dielectric layer comprises a TEOS-based oxide layer.

According to some embodiments, the semiconductor memory device further comprises an etch stop layer between the first interlayer dielectric layer and the second interlayer dielectric layer.

According to some embodiments, the etch stop layer comprises a nitrogen-doped silicon carbide (NDC) layer.

According to some embodiments, the second interlayer dielectric layer is in direct contact with the etch stop layer.

According to some embodiments, the at least one via comprises a tungsten via.

According to some embodiments, the semiconductor memory device further comprises a protective layer conformally covering the at least one data storage structure, the first recess structure of the second interlayer dielectric layer, and the second recess structure of the second interlayer dielectric layer; and a third interlayer dielectric layer on the protective layer.

According to some embodiments, the protective layer comprises a silicon nitride layer.

Another aspect of the invention provides a method of forming a semiconductor memory device. A substrate comprising a memory region and a logic circuit region is provided. A first interlayer dielectric layer is formed on the substrate. A second interlayer dielectric layer is formed on the first interlayer dielectric layer. At least one via is formed in the second interlayer dielectric layer within the memory region. At least one data storage structure is stacked on the at least one via. The second interlayer dielectric layer comprises a first recess structure with a first recessed thickness between a bottom surface of the at least one data storage structure and a lowest point of the second interlayer dielectric layer within the memory region, and a second recess structure with a second recessed thickness between the bottom surface of the at least one data storage structure and a lowest point of the second interlayer dielectric layer within the logic circuit region.

According to some embodiments, the first recessed thickness ranges between 300-650 angstroms and the second recessed thickness ranges between 300-800 angstroms.

According to some embodiments, the method further comprises the step of forming a step structure on the second interlayer dielectric layer at an interface between the memory region and the logic circuit region.

According to some embodiments, the data storage structure comprises a bottom electrode, a magnetic tunneling junction (MTJ) element on the bottom electrode, and a top electrode on the MTJ element.

According to some embodiments, the second interlayer dielectric layer comprises a TEOS-based oxide layer.

According to some embodiments, the method further comprises the step of forming an etch stop layer between the first interlayer dielectric layer and the second interlayer dielectric layer.

According to some embodiments, the etch stop layer comprises a nitrogen-doped silicon carbide (NDC) layer.

According to some embodiments, the second interlayer dielectric layer is in direct contact with the etch stop layer.

According to some embodiments, the at least one via comprises a tungsten via.

According to some embodiments, the method further comprises the steps of forming a protective layer conformally covering the at least one data storage structure, the first recess structure of the second interlayer dielectric layer, and the second recess structure of the second interlayer dielectric layer; and forming a third interlayer dielectric layer on the protective layer.

According to some embodiments, the protective layer comprises a silicon nitride layer.

Still another aspect of the invention provides a semiconductor memory device including a substrate comprising a memory region and a logic circuit region; a first interlayer dielectric layer on the substrate; a second interlayer dielectric layer on the first interlayer dielectric layer, wherein the second interlayer dielectric layer has a step structure at an interface between the memory region and the logic circuit region; at least one via in the second interlayer dielectric layer within the memory region; and at least one data storage structure stacked on the at least one via.

According to some embodiments, the second interlayer dielectric layer comprises a first recess structure with a first recessed thickness between a bottom surface of the at least one data storage structure and a lowest point of the second interlayer dielectric layer within the memory region, and a second recess structure with a second recessed thickness between the bottom surface of the at least one data storage structure and a lowest point of the second interlayer dielectric layer within the logic circuit region, wherein the first recessed thickness ranges between 300-650 angstroms and the second recessed thickness ranges between 300-800 angstroms.

According to some embodiments, the data storage structure comprises a bottom electrode, a magnetic tunneling junction (MTJ) element on the bottom electrode, and a top electrode on the MTJ element.

According to some embodiments, the second interlayer dielectric layer comprises a TEOS-based oxide layer.

According to some embodiments, the semiconductor memory device further comprises an etch stop layer between the first interlayer dielectric layer and the second interlayer dielectric layer.

According to some embodiments, the etch stop layer comprises a nitrogen-doped silicon carbide (NDC) layer.

According to some embodiments, the second interlayer dielectric layer is in direct contact with the etch stop layer.

According to some embodiments, the at least one via comprises a tungsten via.

According to some embodiments, the semiconductor memory device further comprises a protective layer conformally covering the at least one data storage structure, the first recess structure of the second interlayer dielectric layer, and the second recess structure of the second interlayer dielectric layer; and a third interlayer dielectric layer on the protective layer. According to some embodiments, the protective layer comprises a silicon nitride layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
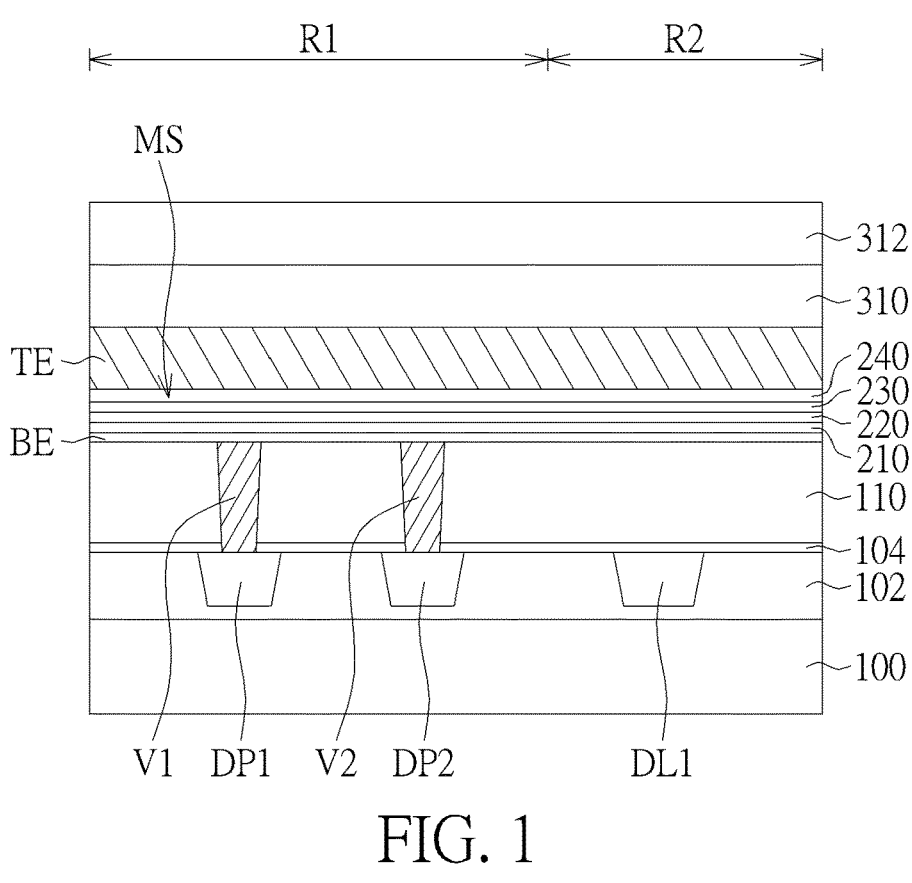
FIG. 1 to FIG. 6 are schematic diagrams showing a method of manufacturing a magnetic random access memory structure according to an embodiment of the present invention.
Figure 1:
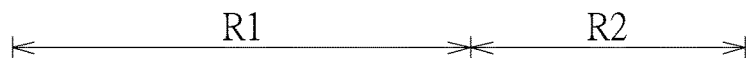

Please refer to FIG. 1 to FIG. 6, which are schematic diagrams showing a method of manufacturing a magnetic random access memory structure according to an embodiment of the present invention. As shown in FIG. 1, a substrate 100 such as a silicon substrate is provided. The substrate 100 has a memory region R1 and a logic circuit region R2 thereon. According to an embodiment of the present invention, for example, a low dielectric constant (low-k) dielectric layer 102 is formed in the memory region R1 and the logic circuit region R2 on the substrate 100. For example, pad structures DP1 and DP2 are formed in the low-k dielectric layer 102 in the memory region R1. For example, an interconnect structure DL1 is formed in the low-k dielectric layer 102 in the logic circuit region R2.

According to an embodiment of the present invention, for example, the pad structures DP1 and DP2 and the interconnect structure DL1 may be copper damascene structures. According to an embodiment of the present invention, for example, the interconnect structure DL1 and the pad structures DP1 and DP2 may be located in the second metal layer (M2), but not limited thereto.

According to an embodiment of the present invention, for example, the surface of the pad structures DP1 and DP2 and the surface of the low-k dielectric layer 102 are covered with an etch stop layer 104, such as a nitrogen-doped silicon carbide (NDC) layer. According to an embodiment of the present invention, a dielectric layer 110, such as a tetraethoxysilane (TEOS) based oxide layer, is deposited on the etch stop layer 104. Conductive vias V1 and V2 are formed in the dielectric layer 110 in the memory region R1. According to an embodiment of the present invention, for example, the conductive vias V1 and V2 may be tungsten vias.

Subsequently, a bottom electrode layer BE is formed on the dielectric layer 110. According to an embodiment of the present invention, the bottom electrode layer BE is electrically connected to the conductive via V1 and the conductive via V2. According to an embodiment of the present invention, for example, the bottom electrode layer BE may include tantalum nitride (TaN), but is not limited thereto.

Next, a magnetic tunnel junction (MTJ) stack structure MS composed of, for example, a free layer 210, a tunnel barrier layer 220, a reference layer 230, and a cap layer 240 is formed on the bottom electrode layer BE.

Subsequently, a top electrode layer TE and an oxide mask layer 310 are formed on the MTJ stack structure MS. According to an embodiment of the present invention, for example, the top electrode layer TE may include titanium nitride. A chemical vapor deposition (CVD) process is then performed to form a silicon nitride sacrificial layer 312 on the oxide mask layer 310.

Figure 2:
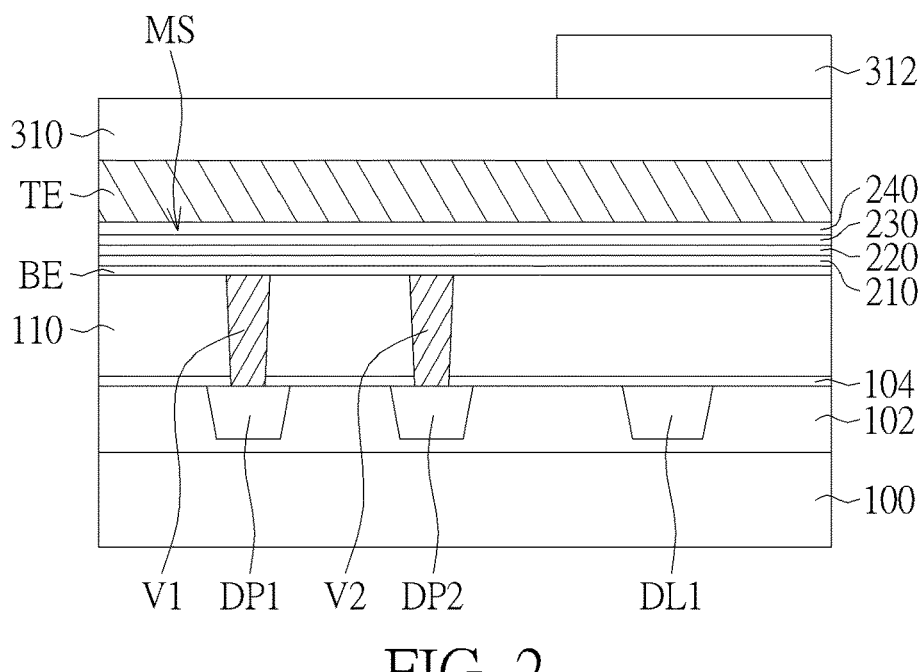

As shown in FIG. 2, a lithography process and an etching process are then performed to remove the silicon nitride sacrificial layer 312 from the memory region R1, thereby revealing the oxide mask layer 310 within the memory region R1. The silicon nitride sacrificial layer 312 in the logic circuit region R2 is remained.

Figure 3:
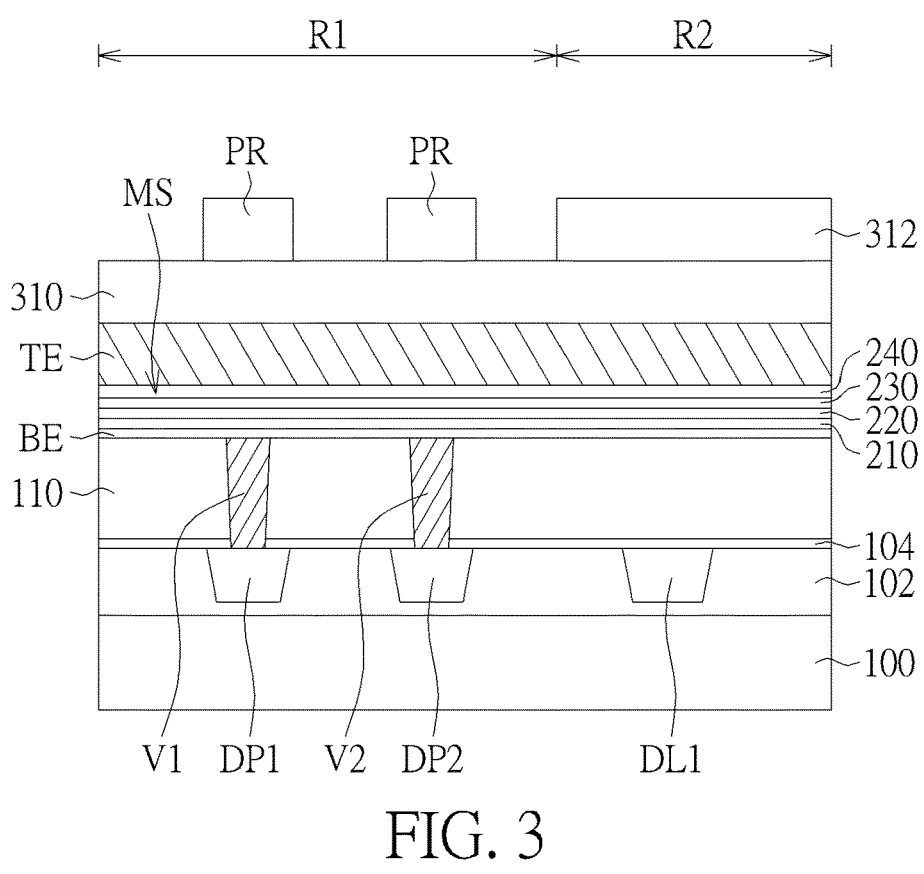

As shown in FIG. 3, a lithography process is then performed to form a photoresist pattern PR on the oxide mask layer 310 within the memory region R1 to define the position and pattern of the data storage structure or MTJ pillar to be formed in a later stage.

Figure 4:
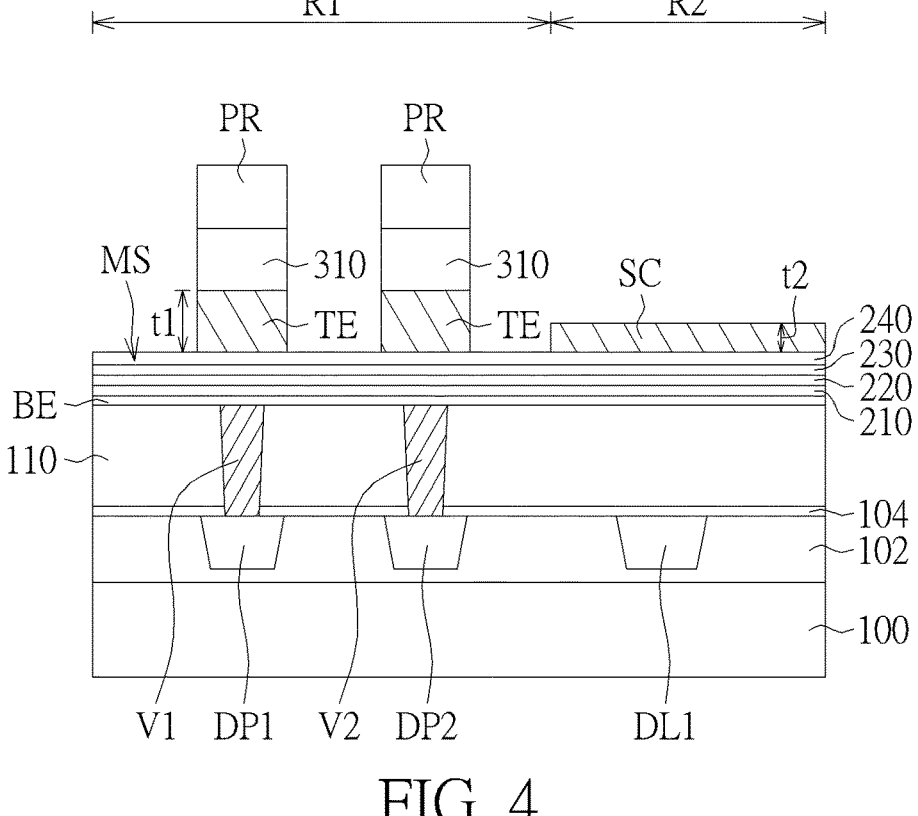

As shown in FIG. 4, an anisotropic dry etching process is performed, using the photoresist pattern PR as an etching resist layer, to etch the silicon nitride sacrificial layer 312, the oxide mask layer 310 and the top electrode layer TE, thereby patterning the top electrode layer TE in the memory region R1, and forming a metal sacrificial layer SC composed of part of the top electrode layer TE in the logic circuit region R2. According to an embodiment of the present invention, the thickness t1 of the patterned top electrode layer TE in the memory region R1 is greater than the thickness t2 of the metal sacrificial layer SC in the logic circuit region R2.

Figure 5:
Figure 5:
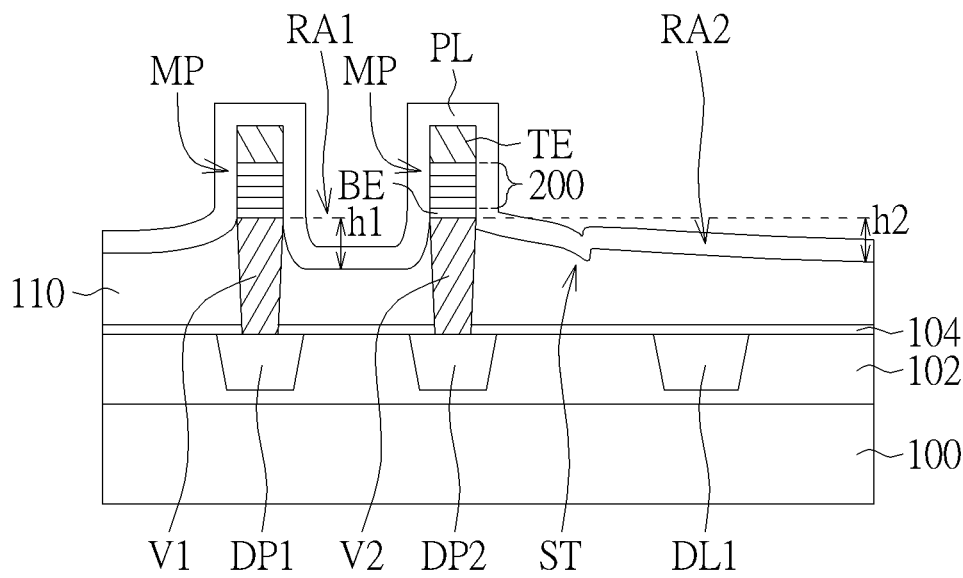

As shown in FIG. 5, after removing the remaining photoresist pattern PR, an ion beam etching (IBE) process is performed to etch the MTJ stack structure MS not covered by the patterned top electrode layer TE. The data storage structure MP is formed on the conductive vias V1 and V2 in the memory region R1, and the dielectric layer 110 is exposed. The data storage structure MP includes a bottom electrode BE, a magnetic tunnel junction (MTJ) element 200 on the bottom electrode BE, and a top electrode TE on the MTJ element 200.

At this point, the dielectric layer 110 includes a first recess structure RA1 in the memory region R1 and a second recess structure RA2 in the logic circuit region R2. According to an embodiment of the present invention, the first recess structure RA1 has a first recessed thickness h1 between the bottom surface of the data storage structure MP and the lowest point of the dielectric layer 110 in the memory region R1, and the second recess structure RA2 has a second recessed thickness h2 between the bottom surface of the data storage structure MP and the lowest point of the dielectric layer 110 in the logic circuit region R2. The first recessed thickness h1 is between 300-650 angstroms, and the second recessed thickness h2 is between 300-800 angstroms. In addition, the dielectric layer 110 has a step structure ST at the interface between the memory region R1 and the logic circuit region R2.

Subsequently, a CVD process is performed to deposit a protective layer PL, for example, a silicon nitride layer, on the substrate 100 in a blanket manner. The protective layer PL conformally covers the data storage structure MP, the first recess structure RA1 of the dielectric layer 110 and the second recess structure RA2 of the dielectric layer 110.

Figure 6:
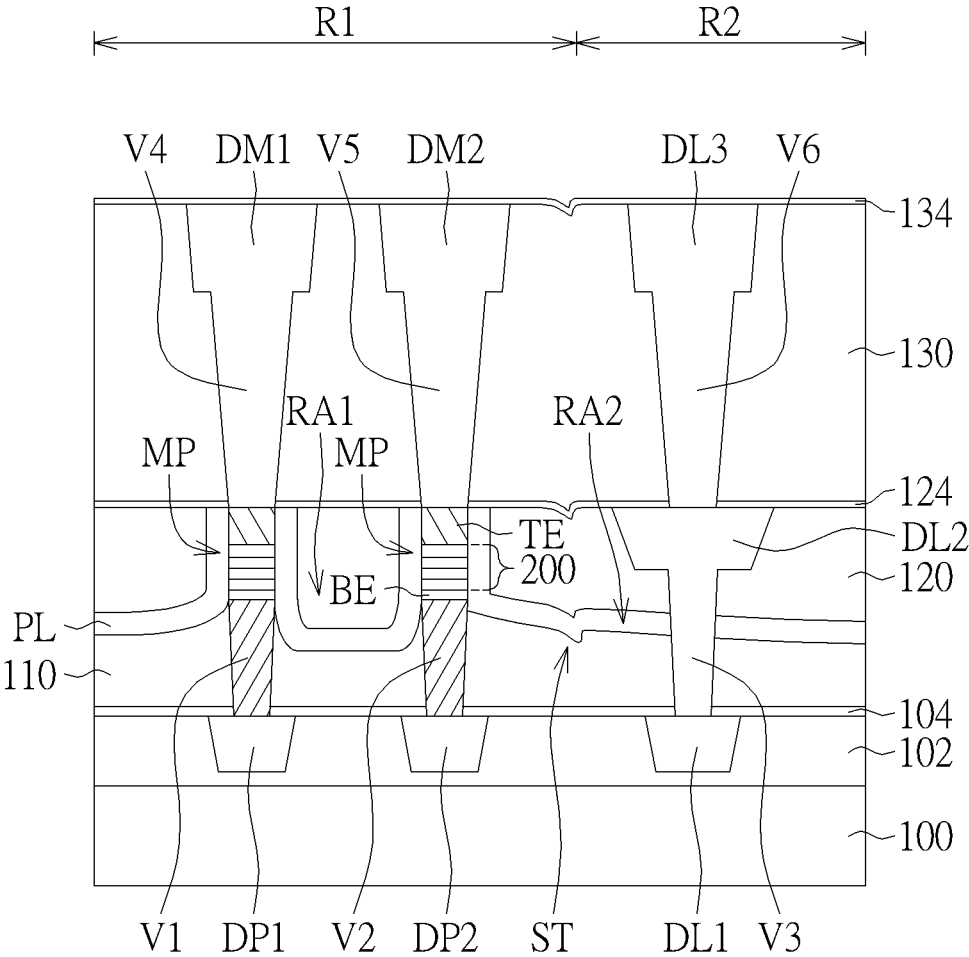

As shown in FIG. 6, a CVD process is then performed to deposit a dielectric layer 120, such as a silicon oxide layer, on the substrate 100 in a blanket manner. According to an embodiment of the present invention, the dielectric layer 120 covers the protective layer PL. Next, a chemical mechanical polishing (CMP) process is performed to planarize the dielectric layer 120 and polish away part of the passivation layer PL and the top electrode layer TE.

Subsequently, the metallization process in the logic circuit region R2 is performed to form the interconnect structure DL2 and the conductive via V3. According to an embodiment of the present invention, for example, the interconnect structure DL2 and the conductive via V3 may be a copper dual damascene structure. According to an embodiment of the present invention, for example, the interconnect structure DL2 may be located in the third metal layer (M3), but is not limited thereto. An etch stop layer 124 is then formed to cover the dielectric layer 120 and the top electrode layer TE. A low-k dielectric layer 130 is then formed on the etch stop layer 124.

Subsequently, the metallization process in the memory area R1 and the logic circuit area R2 is performed to form interconnect structures DM1, DM2, DL3 and conductive vias V4-V6, respectively. According to an embodiment of the present invention, for example, the interconnect structures DM1, DM2, DL3 and the conductive vias V4-V6 may be copper dual damascene structures. According to an embodiment of the present invention, for example, the interconnect structures DM1, DM2, DL3 may be located in the fourth metal layer (M4), but not limited thereto. According to an embodiment of the present invention, the interconnect structures DM1, DM2 are electrically connected to the top electrode layer TE through the conductive vias V4, V5. An etch stop layer 134 may be then formed to cover the low-k dielectric layer 130 and the interconnect structures DM1, DM2, DL3.

Figure 7:
FIG. 7 to FIG. 11 are schematic diagrams showing a method of manufacturing a magnetic random access memory structure according to another embodiment of the present invention.
Figure 7:
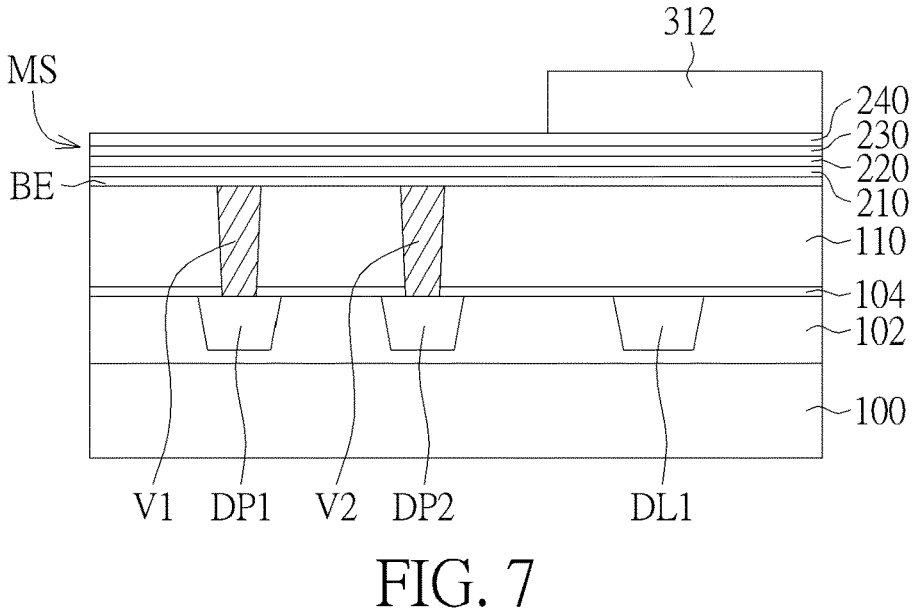

Please refer to FIG. 7 to FIG. 11, which are schematic diagrams showing a method of manufacturing a magnetic random access memory structure according to another embodiment of the present invention. As shown in FIG. 7, a substrate 100 such as a silicon substrate is provided. The substrate 100 has a memory region R1 and a logic circuit region R2 thereon. According to an embodiment of the present invention, for example, a low-k dielectric layer 102 is formed in the memory region R1 and the logic circuit region R2 on the substrate 100. For example, pad structures DP1 and DP2 are formed in the low-k dielectric layer 102 in the memory region R1. For example, an interconnect structure DL1 is formed in the low-k dielectric layer 102 in the logic circuit region R2.

According to an embodiment of the present invention, for example, the pad structures DP1 and DP2 and the interconnect structure DL1 may be copper damascene structures. According to an embodiment of the present invention, for example, the interconnect structure DL1 and the pad structures DP1 and DP2 may be located in the second metal layer (M2), but not limited thereto.

According to an embodiment of the present invention, for example, the surface of the pad structures DP1 and DP2 and the surface of the low-k dielectric layer 102 are covered with an etch stop layer 104 such as a nitrogen-doped silicon carbide layer. According to an embodiment of the present invention, a dielectric layer 110, such as a TEOS-based oxide layer, is deposited on the etch stop layer 104. Conductive vias V1 and V2 are formed in the dielectric layer 110 in the memory region R1. According to an embodiment of the present invention, for example, the conductive vias V1 and V2 may be tungsten vias.

Subsequently, a bottom electrode layer BE is formed on the dielectric layer 110. According to an embodiment of the present invention, the bottom electrode layer BE is electrically connected to the conductive via V1 and the conductive via V2. According to an embodiment of the present invention, for example, the bottom electrode layer BE may include tantalum nitride (TaN), but is not limited thereto. Subsequently, a magnetic tunnel junction (MTJ) stack structure MS composed of, for example, a free layer 210, a tunnel barrier layer 220, a reference layer 230, and a cap layer 240 is formed on the bottom electrode layer BE.

Subsequently, a CVD process is performed to form a silicon nitride sacrificial layer 312 on the cap layer 240. The lithography process and etching process are then performed to remove the silicon nitride sacrificial layer 312 from the memory region R1 to reveal the cap layer 240 within the memory region R1. The silicon nitride sacrificial layer 312 in the logic circuit region R2 is remained.

Figure 8:
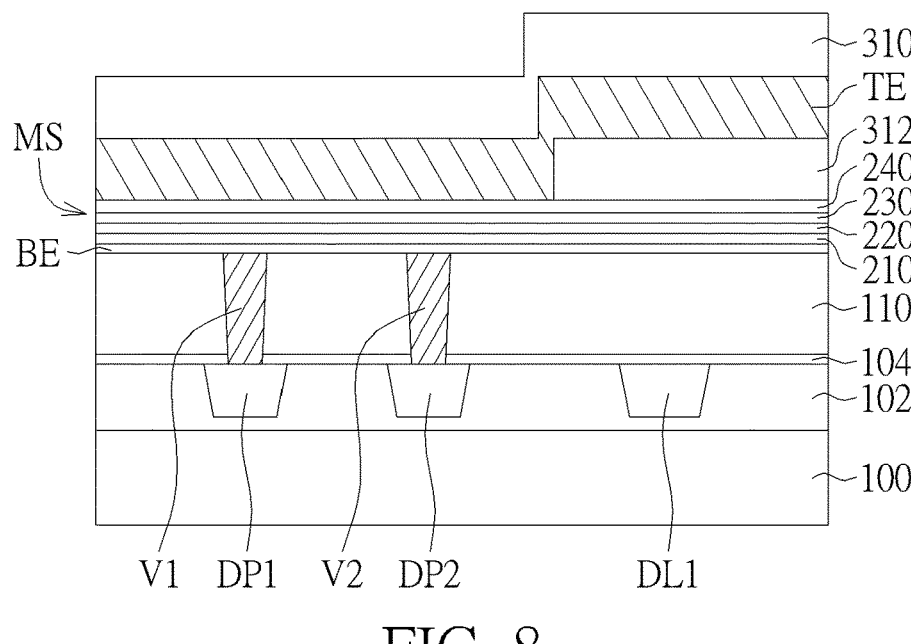

As shown in FIG. 8, next, a top electrode layer TE and an oxide mask layer 310 are formed in the memory region R1 and the logic circuit region R2. At this point, the top electrode layer TE and the oxide mask layer 310 cover the silicon nitride sacrificial layer 312 in the logic circuit region R2. According to an embodiment of the present invention, for example, the top electrode layer TE may include titanium nitride.

Figure 9:
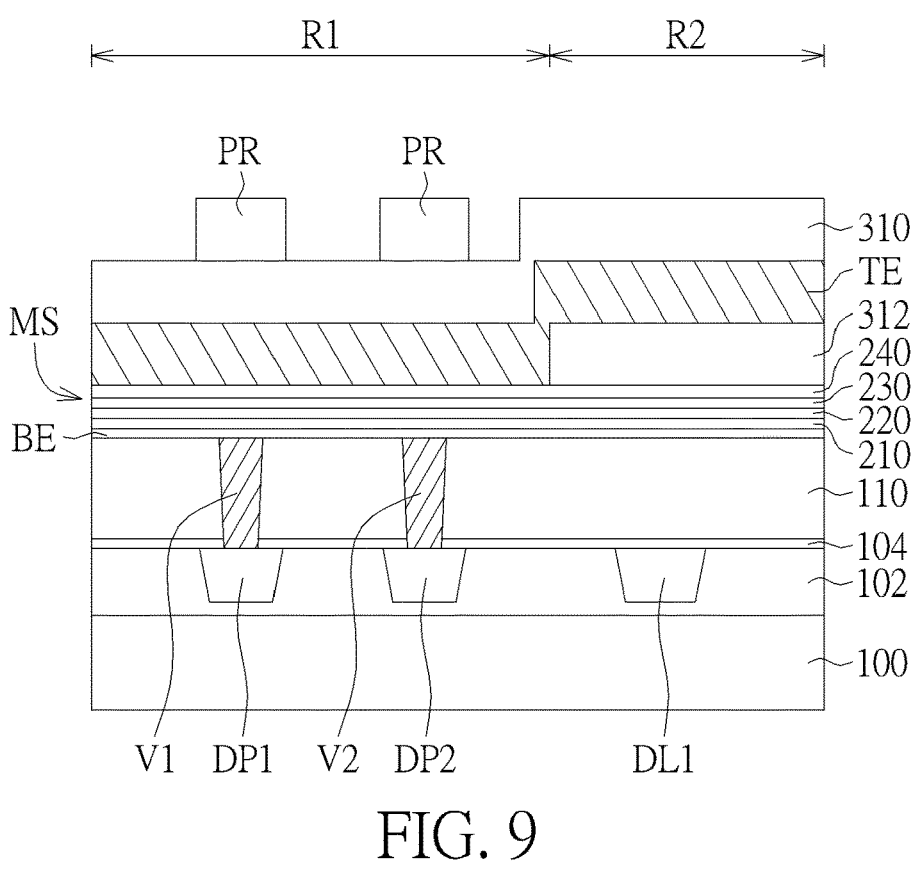

As shown in FIG. 9, a lithography process is then performed to form a photoresist pattern PR on the oxide mask layer 310 within the memory region R1 to define the position and pattern of the data storage structure or MTJ pillar to be formed in a later stage.

Figure 10:
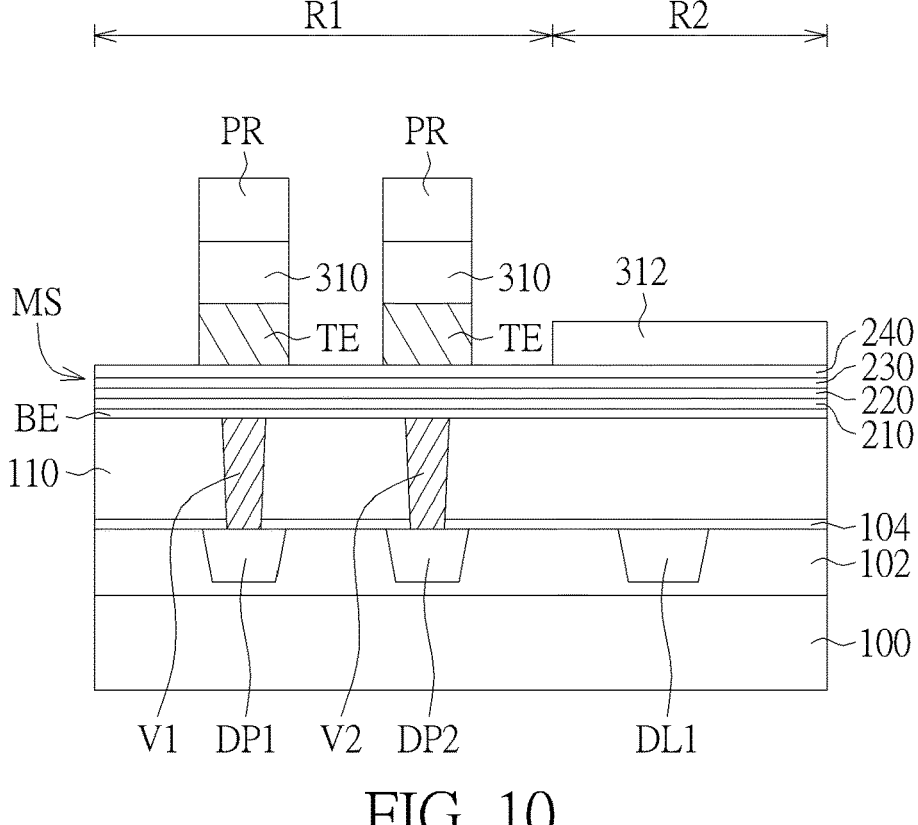

As shown in FIG. 10, an anisotropic dry etching process is performed, and the photoresist pattern PR is used as an etching resist layer to etch the oxide mask layer 310, the top electrode layer TE and the silicon nitride sacrificial layer 312, thereby patterning the top electrode layer TE in the memory region R1. A partial thickness of the silicon nitride sacrificial layer 312 is reserved in the logic circuit region R2.

Figure 11:
Figure 11:
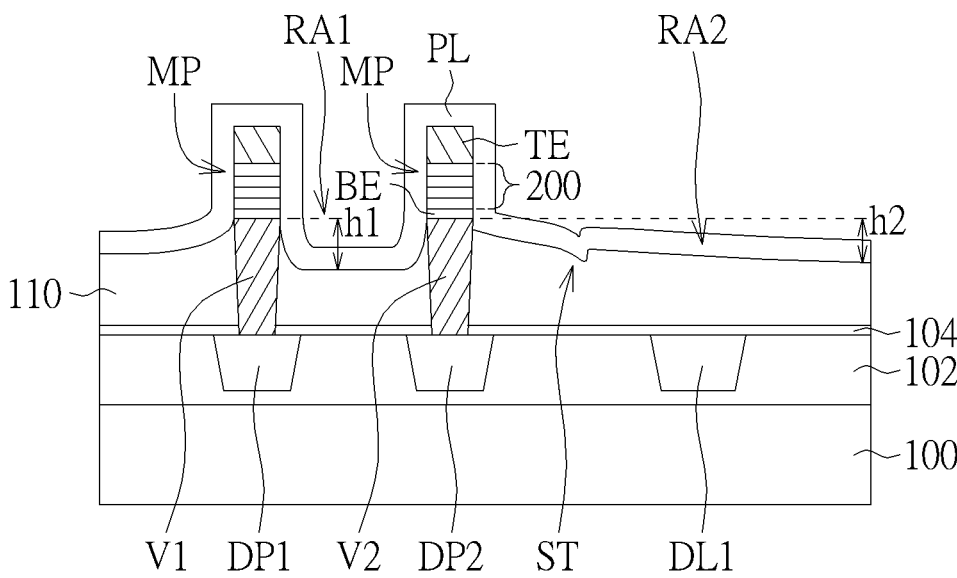

As shown in FIG. 11, after removing the remaining photoresist pattern PR, an ion beam etching process is performed to etch the MTJ stack structure MS not covered by the patterned top electrode layer TE, thereby forming a data storage structure MP on the conductive vias V1 and V2 in the memory region R1, and the dielectric layer 110 is exposed. The data storage structure MP includes a bottom electrode BE, a MTJ element 200 on the bottom electrode BE, and a top electrode TE on the MTJ element 200.

At this point, the dielectric layer 110 includes a first recess structure RA1 in the memory region R1 and a second recess structure RA2 in the logic circuit region R2. According to an embodiment of the present invention, the first recess structure RA1 has a first recessed thickness h1 between the bottom surface of the data storage structure MP and the lowest point of the dielectric layer 110 in the memory region R1, and the second recess structure RA2 has a second recessed thickness h2 between the bottom surface of the data storage structure MP and the lowest point of the dielectric layer 110 in the logic circuit region R2. The first recessed thickness h1 is between 300-650 angstroms, and the second recessed thickness h2 is between 300-800 angstroms. In addition, the dielectric layer 110 has a step structure ST at the interface between the memory region R1 and the logic circuit region R2.

Subsequently, a CVD process is performed to deposit a protective layer PL, for example, a silicon nitride layer, on the substrate 100 in a blanket manner. The protective layer PL conformally covers the data storage structure MP, the first recess structure RA1 of the dielectric layer 110 and the second recess structure RA2 of the dielectric layer 110. Subsequent metallization process is carried out, and the steps are similar to those shown in FIG. 6, so details are not repeated here.

Figure 12:
FIG. 12 to FIG. 17 are schematic diagrams showing a method of manufacturing a magnetic random access memory structure according to still another embodiment of the present invention.
Figure 12:
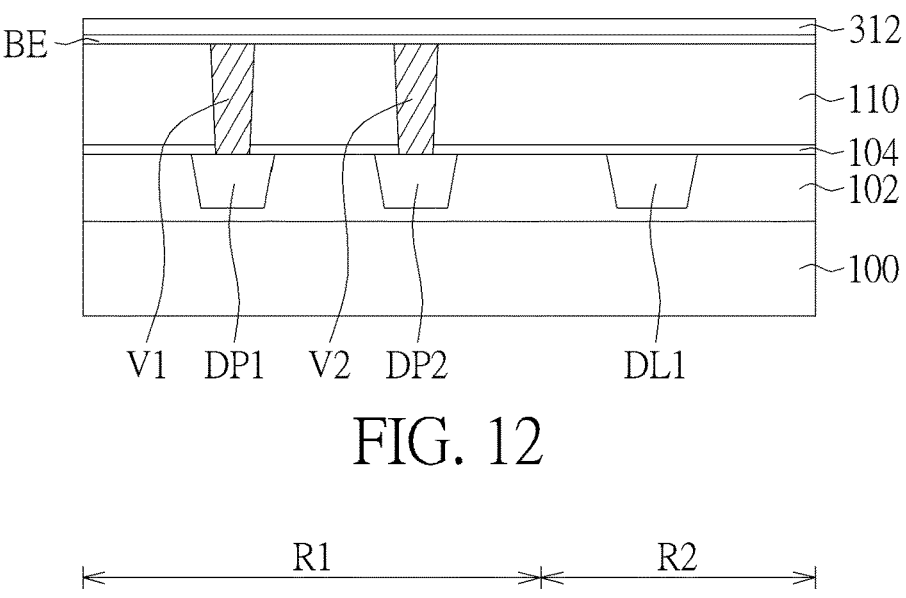

Please refer to FIG. 12 to FIG. 17, which are schematic diagrams showing a method of manufacturing a magnetic random access memory structure according to still another embodiment of the present invention. As shown in FIG. 12, a substrate 100 such as a silicon substrate is provided. The substrate 100 has a memory region R1 and a logic circuit region R2 thereon. According to an embodiment of the present invention, for example, a low-k dielectric layer 102 is formed in the memory region R1 and the logic circuit region R2 on the substrate 100. For example, pad structures DP1 and DP2 are formed in the low-k dielectric layer 102 in the memory region R1. For example, an interconnect structure DL1 is formed in the low-k dielectric layer 102 in the logic circuit region R2.

According to an embodiment of the present invention, for example, the pad structures DP1 and DP2 and the interconnect structure DL1 may be copper damascene structures. According to an embodiment of the present invention, for example, the interconnect structure DL1 and the pad structures DP1 and DP2 may be located in the second metal layer (M2), but not limited thereto.

According to an embodiment of the present invention, for example, the surface of the pad structures DP1 and DP2 and the surface of the low-k dielectric layer 102 are covered with an etch stop layer 104, such as a nitrogen-doped silicon carbide layer. According to an embodiment of the present invention, a dielectric layer 110, such as a TEOS-based oxide layer, is deposited on the etch stop layer 104. Conductive vias V1 and V2 are formed in the dielectric layer 110 in the memory region R1. According to an embodiment of the present invention, for example, the conductive vias V1 and V2 may be tungsten vias.

Subsequently, a bottom electrode layer BE is formed on the dielectric layer 110. According to an embodiment of the present invention, the bottom electrode layer BE is electrically connected to the conductive via V1 and the conductive via V2. According to an embodiment of the present invention, for example, the bottom electrode layer BE may include tantalum nitride, but is not limited thereto. Next, a CVD process is performed to form a sacrificial layer 312, such as a silicon nitride or TEOS-based oxide layer, on the bottom electrode layer BE.

Figure 13:
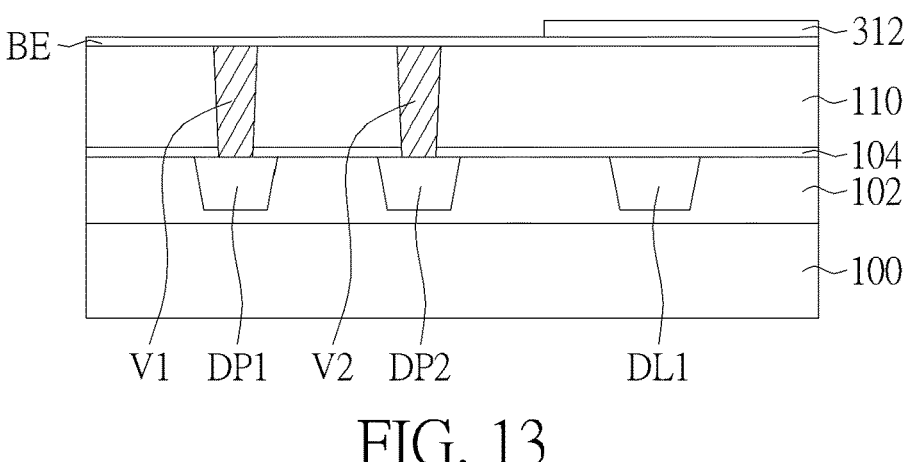

As shown in FIG. 13, a lithography process and an etching process are then performed to remove the sacrificial layer 312 in the memory region R1, revealing the bottom electrode layer BE within the memory region R1. The sacrificial layer 312 in the logic circuit region R2 is remained.

Figure 14:
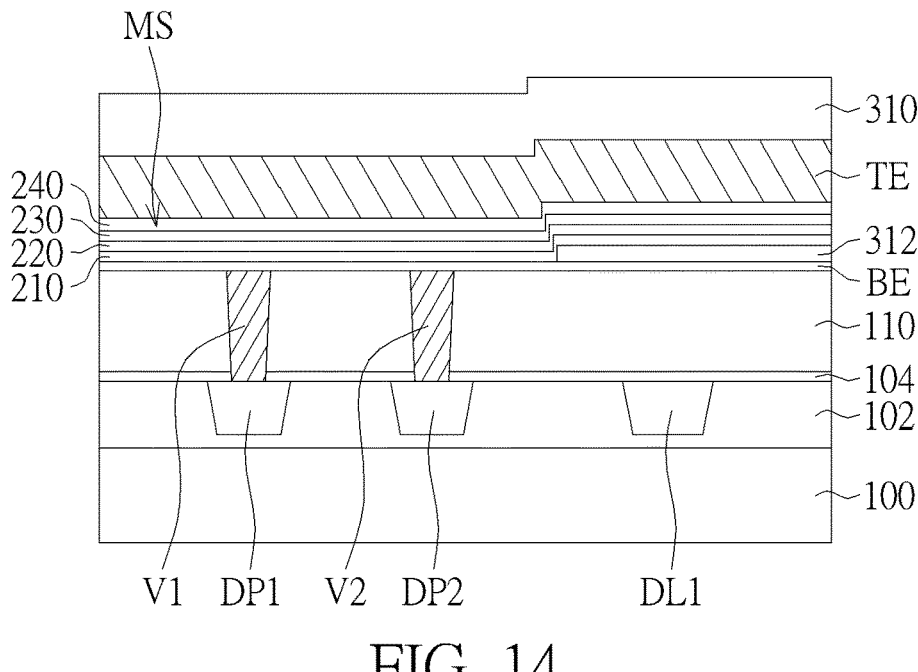

As shown in FIG. 14, for example, a MTJ stack structure MS composed of a free layer 210, a tunnel barrier layer 220, a reference layer 230, and a cap layer 240 is formed on the bottom electrode layer BE. A top electrode layer TE and an oxide mask layer 310 are then formed in the memory region R1 and the logic circuit region R2. At this point, the top electrode layer TE and the oxide mask layer 310 cover the sacrificial layer 312 in the logic circuit region R2. According to an embodiment of the present invention, for example, the top electrode layer TE may include titanium nitride.

Figure 15:
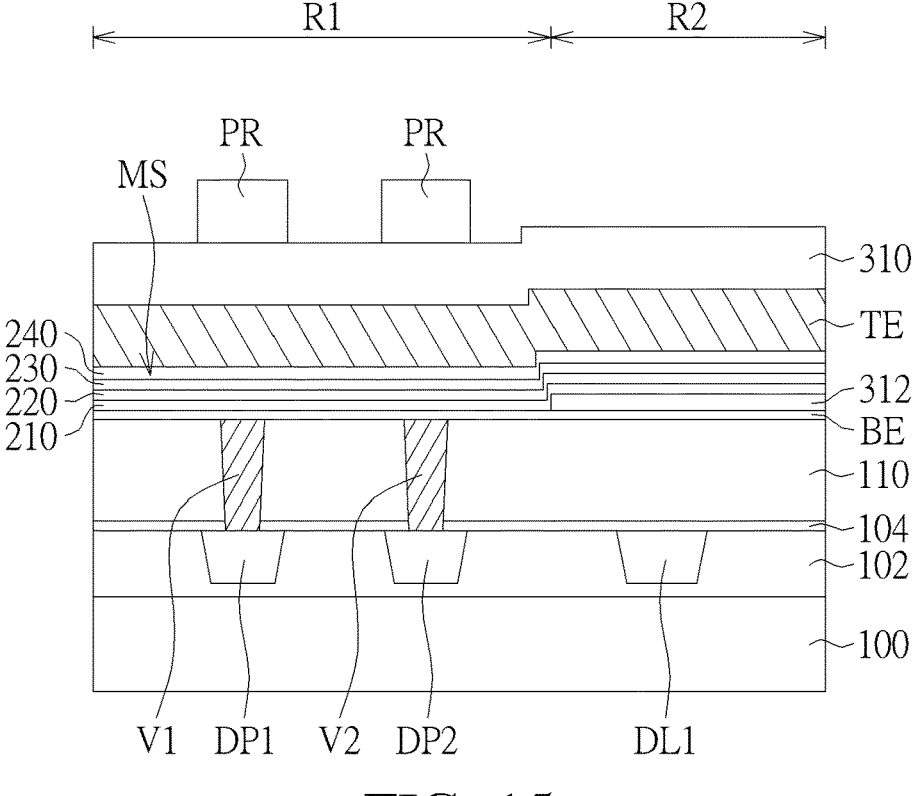

As shown in FIG. 15, a lithography process is then performed to form a photoresist pattern PR on the oxide mask layer 310 of the memory region R1 to define the position and pattern of the data storage structure or MTJ pillar to be formed in a later stage.

Figure 16:
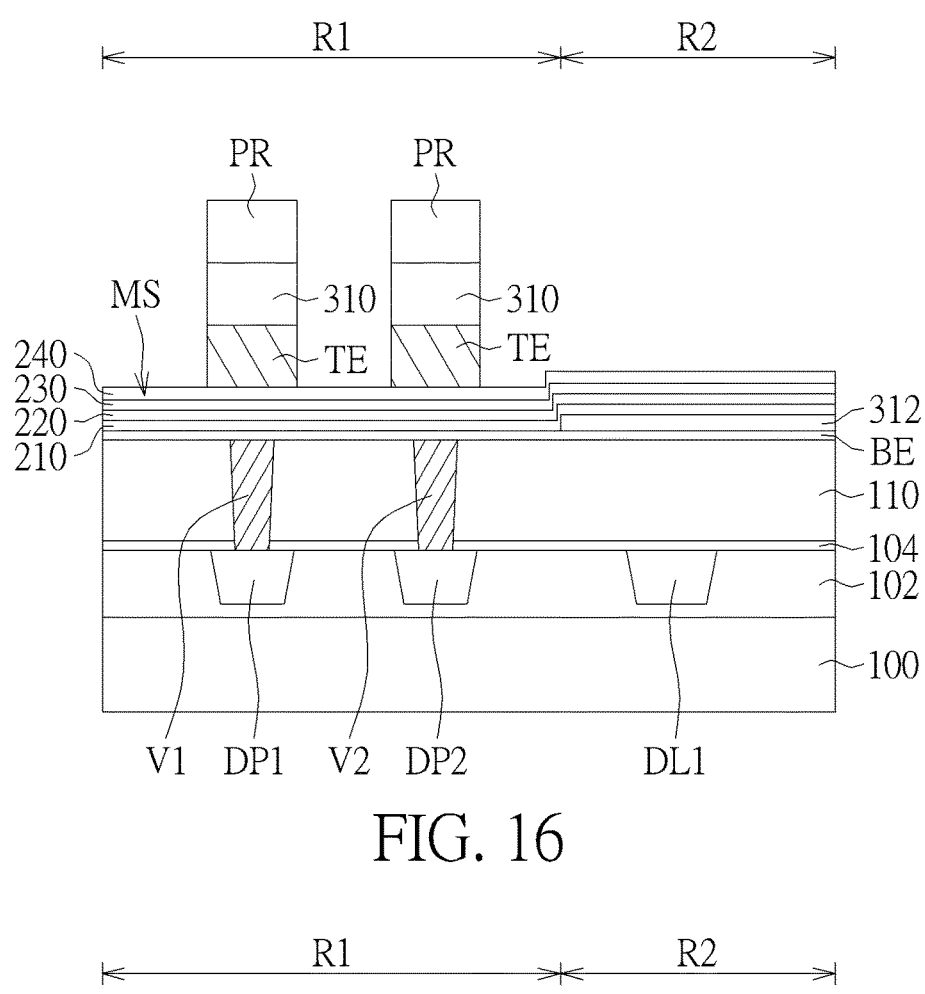

As shown in FIG. 16, an anisotropic dry etching process is performed, and the photoresist pattern PR is used as an etching resist layer to etch the oxide mask layer 310 and the top electrode layer TE, thereby patterning and the top electrode layer TE in the memory region R1.

Figure 17:
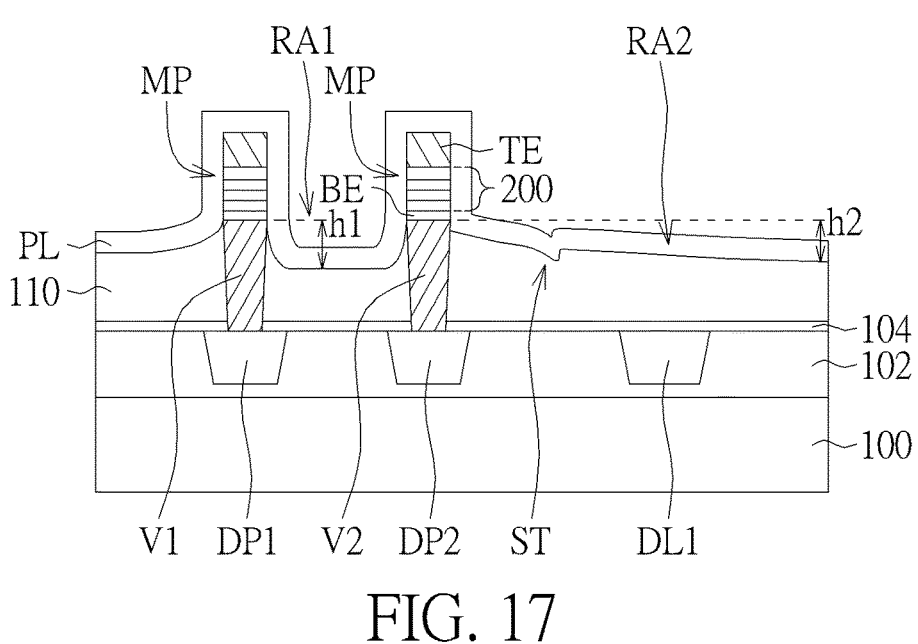

As shown in FIG. 17, after removing the remaining photoresist pattern PR, an ion beam etching process is performed to etch the MTJ stack structure MS not covered by the patterned top electrode layer TE, thereby forming the data storage structure MP on the conductive vias V1 and V2 in the memory region R1, and the dielectric layer 110 is exposed. The data storage structure MP includes a bottom electrode BE, a MTJ element 200 on the bottom electrode BE, and a top electrode TE on the MTJ element 200.

At this point, the dielectric layer 110 includes the first recess structure RA1 in the memory region R1 and the second recess structure RA2 in the logic circuit region R2. According to an embodiment of the present invention, the first recess structure RA1 has a first recessed thickness h1 between the bottom surface of the data storage structure MP and the lowest point of the dielectric layer 110 in the memory region R1, and the second recess structure RA2 has a second recessed thickness h2 between the bottom surface of the data storage structure MP and the lowest point of the dielectric layer 110 in the logic circuit region R2. The first recessed thickness h1 is between 300-650 angstroms, and the second recessed thickness h2 is between 300-800 angstroms. In addition, the dielectric layer 110 has a step structure ST at the interface between the memory region R1 and the logic circuit region R2.

Subsequently, a CVD process is performed to deposit a protective layer PL, for example, a silicon nitride layer, on the substrate 100 in a blanket manner. The protective layer PL conformally covers the data storage structure MP, the first recess structure RA1 of the dielectric layer 110 and the second recess structure RA2 of the dielectric layer 110. Subsequent metallization process is carried out, and the steps are similar to those shown in FIG. 6, so details are not repeated here.

Figure 18:
FIG. 18 to FIG. 22 are schematic diagrams showing a method of manufacturing a magnetic random access memory structure according to yet another embodiment of the present invention.
Figure 18:
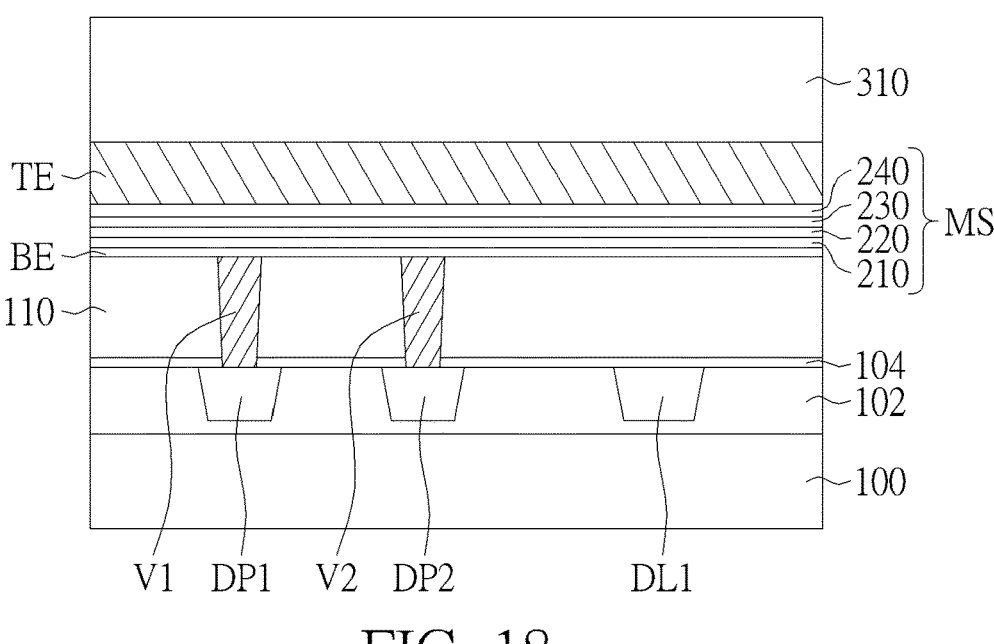

Please refer to FIG. 18 to FIG. 22, which are schematic diagrams showing a method of manufacturing a magnetic random access memory structure according to yet another embodiment of the present invention. As shown in FIG. 18, a substrate 100 such as a silicon substrate is provided. The substrate 100 has a memory region R1 and a logic circuit region R2 thereon. According to an embodiment of the present invention, for example, a low-k dielectric layer 102 is formed in the memory region R1 and the logic circuit region R2 on the substrate 100. For example, pad structures DP1 and DP2 are formed in the low-k dielectric layer 102 in the memory region R1. For example, an interconnect structure DL1 is formed in the low-k dielectric layer 102 in the logic circuit region R2.

According to an embodiment of the present invention, for example, the pad structures DP1 and DP2 and the interconnect structure DL1 may be copper damascene structures. According to an embodiment of the present invention, for example, the interconnect structure DL1 and the pad structures DP1 and DP2 may be located in the second metal layer (M2), but not limited thereto.

According to an embodiment of the present invention, for example, the surface of the pad structures DP1 and DP2 and the surface of the low-k dielectric layer 102 are covered with an etch stop layer 104, such as a nitrogen-doped silicon carbide layer. According to an embodiment of the present invention, a dielectric layer 110, such as a TEOS-based oxide layer, is deposited on the etch stop layer 104. Conductive vias V1 and V2 are formed in the dielectric layer 110 in the memory region R1. According to an embodiment of the present invention, for example, the conductive vias V1 and V2 may be tungsten vias.

Subsequently, a bottom electrode layer BE is formed on the dielectric layer 110. According to an embodiment of the present invention, the bottom electrode layer BE is electrically connected to the conductive via V1 and the conductive via V2. According to an embodiment of the present invention, for example, the bottom electrode layer BE may include tantalum nitride, but is not limited thereto.

Next, for example, a magnetic tunnel junction (MTJ) stack structure MS composed of a free layer 210, a tunnel barrier layer 220, a reference layer 230, and a cap layer 240 is formed on the bottom electrode layer BE. Next, a top electrode layer TE and an oxide mask layer 310 are formed in the memory region R1 and the logic circuit region R2. According to an embodiment of the present invention, for example, the top electrode layer TE may include titanium nitride.

Figure 19:
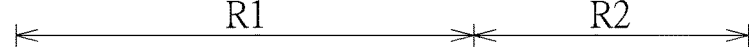
Figure 19:
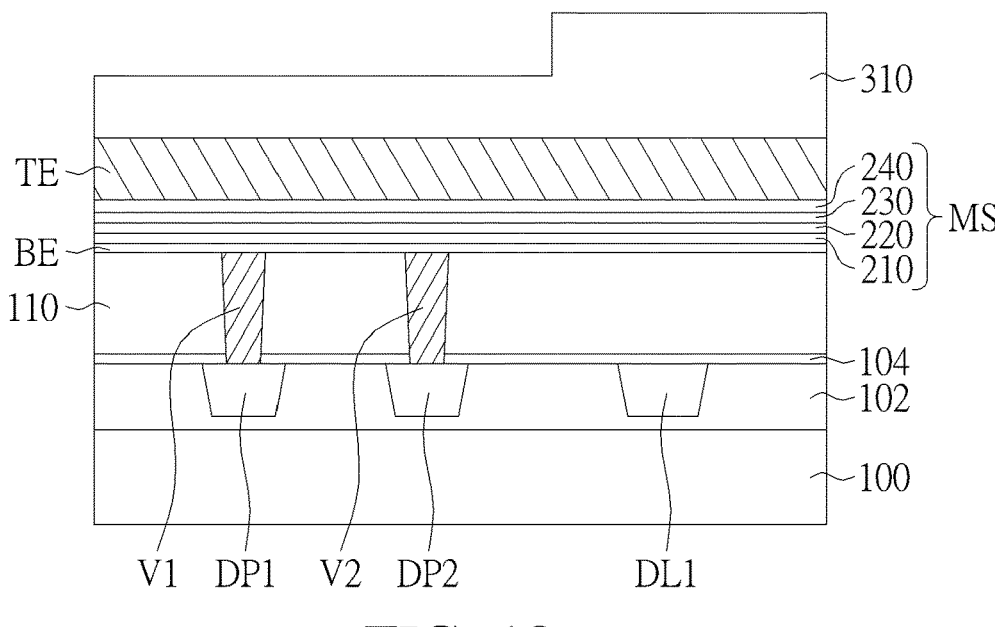

As shown in FIG. 19, a lithography process and an etching process are then performed to remove only a part of the thickness of the oxide mask layer 310 in the memory region R1, but retain the entire thickness of the oxide mask layer 310 in the logic circuit region R2.

Figure 20:
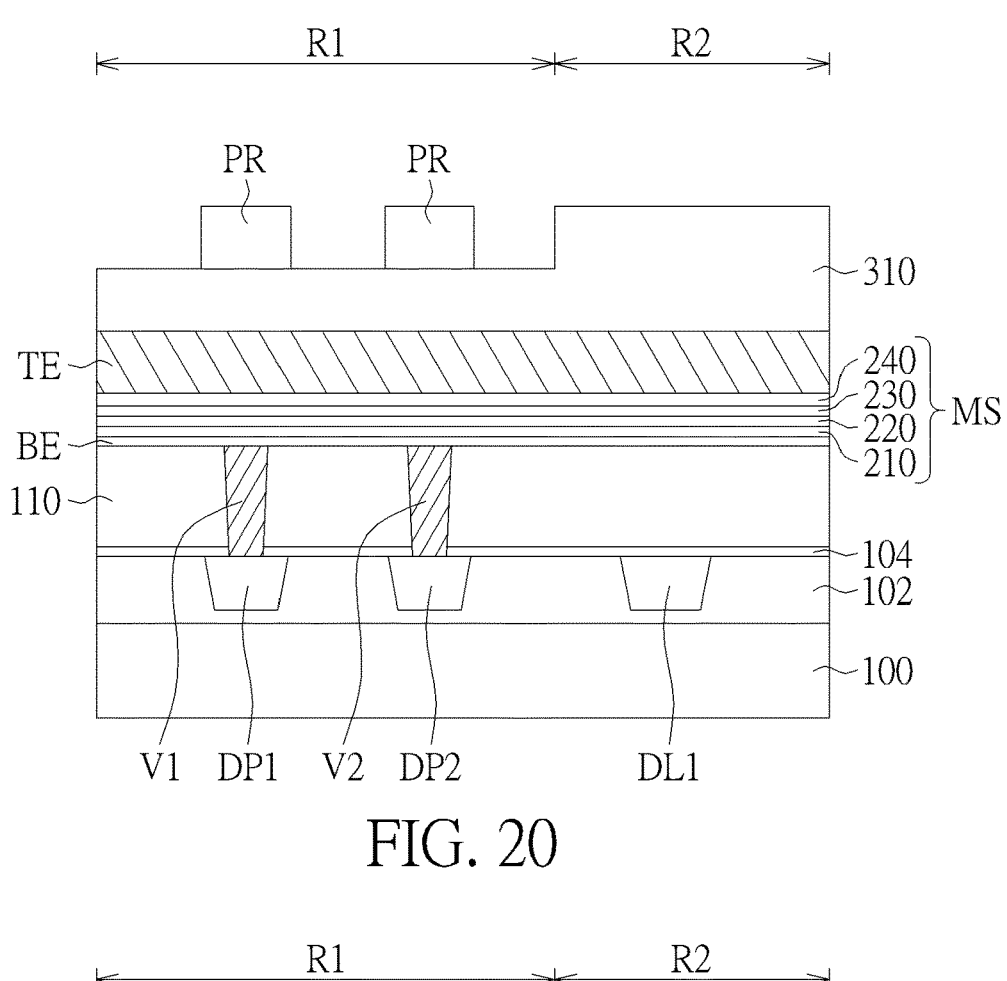

As shown in FIG. 20, a lithography process is then performed to form a photoresist pattern PR on the oxide mask layer 310 of the memory region R1 to define the position and pattern of the data storage structure or MTJ pillar to be formed in a later stage.

Figure 21:
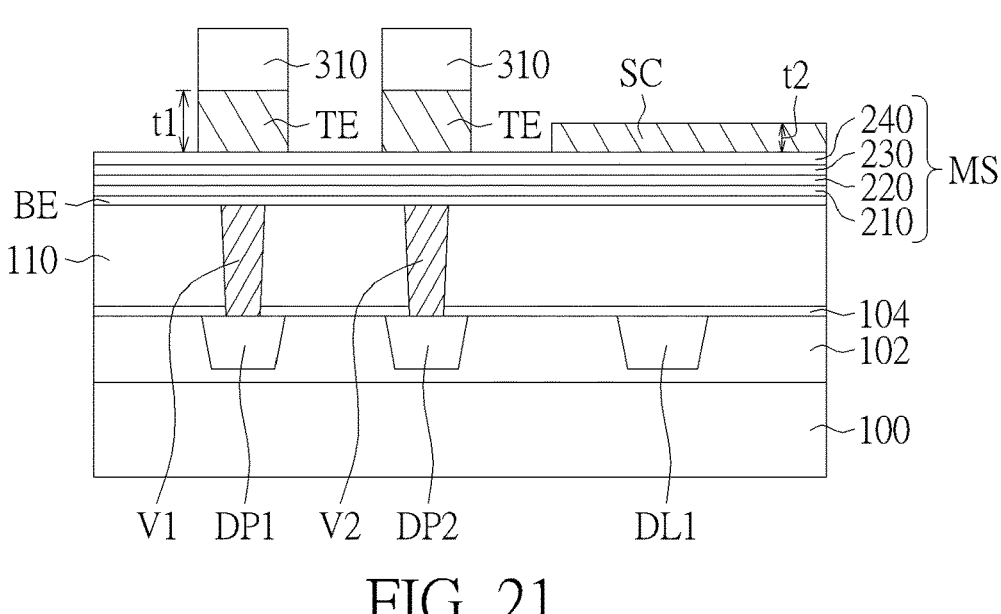

As shown in FIG. 21, an anisotropic dry etching process is performed, and the photoresist pattern PR is used as an etching resist layer to etch the oxide mask layer 310 and the top electrode layer TE, thereby patterning the top electrode layer TE in the memory region R1. A metal sacrificial layer SC composed of part of the top electrode layer TE is formed in the logic circuit region R2. According to an embodiment of the present invention, the thickness t1 of the patterned top electrode layer TE in the memory region R1 is greater than the thickness t2 of the metal sacrificial layer SC in the logic circuit region R2. Next, the remaining photoresist pattern PR is removed.

Figure 22:
Figure 22:
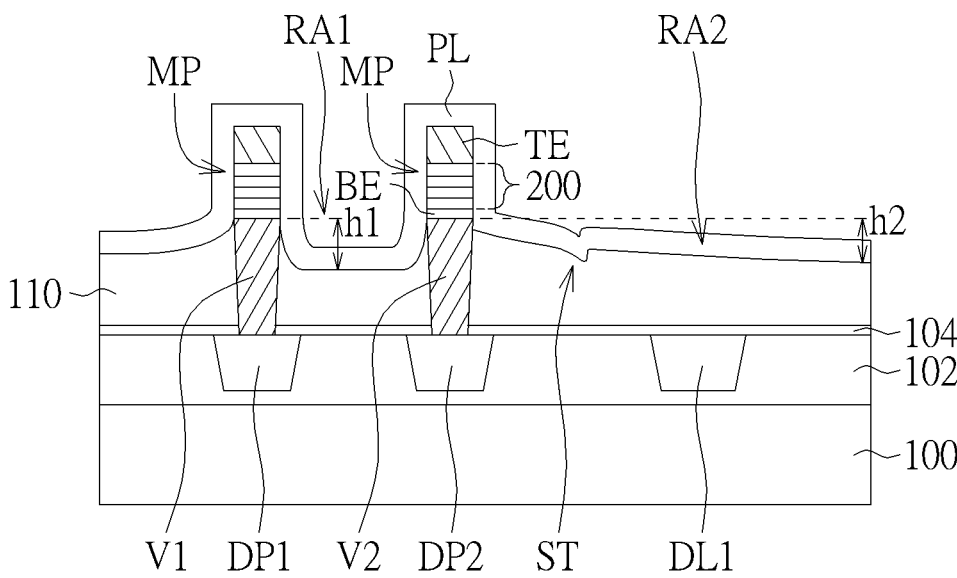

As shown in FIG. 22, an ion beam etching process is performed to etch the MTJ stack structure MS not covered by the patterned top electrode layer TE, thereby forming a data storage structure MP on the conductive vias V1 and V2 in the memory region R1, and the dielectric layer 110 is exposed. The data storage structure MP includes a bottom electrode BE, a MTJ element 200 on the bottom electrode BE, and a top electrode TE on the MTJ element 200.

At this point, the dielectric layer 110 includes the first recess structure RA1 in the memory region R1 and the second recess structure RA2 in the logic circuit region R2. According to an embodiment of the present invention, the first recess structure RA1 has a first recessed thickness h1 between the bottom surface of the data storage structure MP and the lowest point of the dielectric layer 110 in the memory region R1, and the second recess structure RA2 has a second recessed thickness h2 between the bottom surface of the data storage structure MP and the lowest point of the dielectric layer 110 in the logic circuit region R2. The first recessed thickness h1 is between 300-650 angstroms, and the second recessed thickness h2 is between 300-800 angstroms. In addition, the dielectric layer 110 has a step structure ST at the interface between the memory region R1 and the logic circuit region R2.

Subsequently, a CVD process is performed to deposit a protective layer PL, for example, a silicon nitride layer, on the substrate 100 in a blanket manner. The protective layer PL conformally covers the data storage structure MP, the first recess structure RA1 of the dielectric layer 110 and the second recess structure RA2 of the dielectric layer 110. Subsequent metallization process is carried out, and the steps are similar to those shown in FIG. 6, so details are not repeated here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
a substrate comprising a memory region and a logic circuit region;
a first interlayer dielectric layer on the substrate;
a second interlayer dielectric layer on the first interlayer dielectric layer, wherein the second interlayer dielectric layer comprises a step structure at an interface between the memory region and the logic circuit region, wherein the step structure is defined by a first surface of the second interlayer dielectric layer in the memory region and a second surface of the second interlayer dielectric layer in the logic circuit region, and wherein the first surface and the second surface are both sloped surfaces;
at least one via in the second interlayer dielectric layer within the memory region; and
at least one data storage structure stacked on the at least one via, wherein the second interlayer dielectric layer comprises a first recess structure with a first recessed thickness between a bottom surface of the at least one data storage structure and a lowest point of the second interlayer dielectric layer within the memory region, and a second recess structure with a second recessed thickness between the bottom surface of the at least one data storage structure and a lowest point of the second interlayer dielectric layer within the logic circuit region.

2. The semiconductor memory device according to claim 1, wherein the first recessed thickness ranges between 300-650 angstroms and the second recessed thickness ranges between 300-800 angstroms.

3. The semiconductor memory device according to claim 1, wherein the data storage structure comprises a bottom electrode, a magnetic tunneling junction (MTJ) element on the bottom electrode, and a top electrode on the MTJ element.

4. The semiconductor memory device according to claim 1, wherein the second interlayer dielectric layer comprises a tetraethoxysilane-based oxide layer.

5. The semiconductor memory device according to claim 1 further comprising:
an etch stop layer between the first interlayer dielectric layer and the second interlayer dielectric layer.

6. The semiconductor memory device according to claim 5, wherein the etch stop layer comprises a nitrogen-doped silicon carbide (NDC) layer.

7. The semiconductor memory device according to claim 5, wherein the second interlayer dielectric layer is in direct contact with the etch stop layer.

8. The semiconductor memory device according to claim 1, wherein the at least one via comprises a tungsten via.

9. The semiconductor memory device according to claim 1 further comprising:
a protective layer conformally covering the at least one data storage structure, the first recess structure of the second interlayer dielectric layer, and the second recess structure of the second interlayer dielectric layer; and
a third interlayer dielectric layer on the protective layer.

10. The semiconductor memory device according to claim 9, wherein the protective layer comprises a silicon nitride layer.

11. A method of forming a semiconductor memory device, comprising:
providing a substrate comprising a memory region and a logic circuit region;
forming a first interlayer dielectric layer on the substrate;
forming a second interlayer dielectric layer on the first interlayer dielectric layer;
forming a step structure on the second interlayer dielectric layer at an interface between the memory region and the logic circuit region, wherein the step structure is defined by a first surface of the second interlayer dielectric layer in the memory region and a second surface of the second interlayer dielectric layer in the logic circuit region, and wherein the first surface and the second surface are both sloped surfaces;
forming at least one via in the second interlayer dielectric layer within the memory region; and
forming at least one data storage structure stacked on the at least one via, wherein the second interlayer dielectric layer comprises a first recess structure with a first recessed thickness between a bottom surface of the at least one data storage structure and a lowest point of the second interlayer dielectric layer within the memory region, and a second recess structure with a second recessed thickness between the bottom surface of the at least one data storage structure and a lowest point of the second interlayer dielectric layer within the logic circuit region.

12. The method according to claim 11, wherein the first recessed thickness ranges between 300-650 angstroms and the second recessed thickness ranges between 300-800 angstroms.

13. The method according to claim 11, wherein the data storage structure comprises a bottom electrode, a magnetic tunneling junction (MTJ) element on the bottom electrode, and a top electrode on the MTJ element.

14. The method according to claim 11, wherein the second interlayer dielectric layer comprises a tetraethoxysilane-based oxide layer.

15. The method according to claim 11 further comprising:
forming an etch stop layer between the first interlayer dielectric layer and the second interlayer dielectric layer.

16. The method according to claim 15, wherein the etch stop layer comprises a nitrogen-doped silicon carbide (NDC) layer.

17. The method according to claim 15, wherein the second interlayer dielectric layer is in direct contact with the etch stop layer.

18. The method according to claim 11, wherein the at least one via comprises a tungsten via.

19. The method according to claim 11 further comprising:
forming a protective layer conformally covering the at least one data storage structure, the first recess structure of the second interlayer dielectric layer, and the second recess structure of the second interlayer dielectric layer; and forming a third interlayer dielectric layer on the protective layer.

20. The method according to claim 19, wherein the protective layer comprises a silicon nitride layer.

21. A semiconductor memory device, comprising:

a substrate comprising a memory region and a logic circuit region;

a first interlayer dielectric layer on the substrate;

a second interlayer dielectric layer on the first interlayer dielectric layer, wherein the second interlayer dielectric layer has a step structure at an interface between the memory region and the logic circuit region, wherein the step structure is defined by a first surface of the second interlayer dielectric layer in the memory region and a second surface of the second interlayer dielectric layer in the logic circuit region, and wherein the first surface and the second surface are both sloped surfaces;

at least one via in the second interlayer dielectric layer within the memory region; and at least one data storage structure stacked on the at least one via.

22. The semiconductor memory device according to claim 21, wherein the second interlayer dielectric layer comprises a first recess structure with a first recessed thickness between a bottom surface of the at least one data storage structure and a lowest point of the second interlayer dielectric layer within the memory region, and a second recess structure with a second recessed thickness between the bottom surface of the at least one data storage structure and a lowest point of the second interlayer dielectric layer within the logic circuit region, wherein the first recessed thickness ranges between 300-650 angstroms and the second recessed thickness ranges between 300-800 angstroms.

23. The semiconductor memory device according to claim 21, wherein the data storage structure comprises a bottom electrode, a magnetic tunneling junction (MTJ) element on the bottom electrode, and a top electrode on the MTJ element.

24. The semiconductor memory device according to claim 21, wherein the second interlayer dielectric layer comprises a tetraethoxysilane-based oxide layer.

25. The semiconductor memory device according to claim 21 further comprising:

an etch stop layer between the first interlayer dielectric layer and the second interlayer dielectric layer.

26. The semiconductor memory device according to claim 25, wherein the etch stop layer comprises a nitrogen-doped silicon carbide (NDC) layer.

27. The semiconductor memory device according to claim 25, wherein the second interlayer dielectric layer is in direct contact with the etch stop layer.

28. The semiconductor memory device according to claim 21, wherein the at least one via comprises a tungsten via.

29. The semiconductor memory device according to claim 21 further comprising:

a protective layer conformally covering the at least one data storage structure, the first recess structure of the second interlayer dielectric layer, and the second recess structure of the second interlayer dielectric layer; and a third interlayer dielectric layer on the protective layer.

30. The semiconductor memory device according to claim 29, wherein the protective layer comprises a silicon nitride layer.

* * * * *